US010755986B2

(12) United States Patent
Aktas et al.

(10) Patent No.: US 10,755,986 B2
(45) Date of Patent: Aug. 25, 2020

(54) ALUMINUM NITRIDE BASED SILICON-ON-INSULATOR SUBSTRATE STRUCTURE

(71) Applicant: QROMIS, Inc., Santa Clara, CA (US)

(72) Inventors: Ozgur Aktas, Pleasanton, CA (US); Vladimir Odnoblyudov, Danville, CA (US); Dilip Risbud, San Jose, CA (US); Cem Basceri, Los Gatos, CA (US)

(73) Assignee: QROMIS, INC., Santa Clara, CA (US)

( * ) Notice: Subject to any disclaimer, the term of this patent is extended or adjusted under 35 U.S.C. 154(b) by 62 days.

(21) Appl. No.: 15/471,707

(22) Filed: Mar. 28, 2017

(65) Prior Publication Data
US 2017/0288055 A1 Oct. 5, 2017

Related U.S. Application Data

(60) Provisional application No. 62/314,557, filed on Mar. 29, 2016, provisional application No. 62/350,084, filed on Jun. 14, 2016.

(51) Int. Cl.
*H01L 21/00* (2006.01)
*H01L 21/84* (2006.01)
*H01L 27/12* (2006.01)

(52) U.S. Cl.
CPC .......... *H01L 21/84* (2013.01); *H01L 27/1203* (2013.01)

(58) Field of Classification Search
CPC ......... H01L 29/78; H01L 29/66; H01L 21/84; H01L 27/12; H01L 29/04
See application file for complete search history.

(56) References Cited

U.S. PATENT DOCUMENTS

| 5,079,102 A * | 1/1992 | Tanaka | C04B 35/645 228/193 |
| 9,650,723 B1 * | 5/2017 | D'Evelyn | C30B 7/105 |
| 2004/0166596 A1 * | 8/2004 | Sashida | H01L 21/3144 438/3 |
| 2008/0142923 A1 * | 6/2008 | Tischler | H01L 21/764 257/531 |
| 2010/0301459 A1 * | 12/2010 | Akiba | H01L 24/03 257/620 |
| 2011/0147772 A1 * | 6/2011 | Lochtefeld | C30B 29/06 257/94 |
| 2013/0112134 A1 * | 5/2013 | Spencer | C30B 15/20 117/13 |
| 2013/0234148 A1 * | 9/2013 | Werkhoven | H01L 29/20 257/76 |
| 2014/0021483 A1 * | 1/2014 | Chu | H01L 21/02458 257/76 |
| 2014/0183442 A1 * | 7/2014 | Odnoblyudov | H01L 33/0079 257/13 |
| 2014/0196498 A1 * | 7/2014 | Xiao | H01L 23/427 62/524 |
| 2017/0154855 A1 * | 6/2017 | Oi | H01L 23/562 |
| 2017/0179307 A1 * | 6/2017 | Dang | H01L 31/024 |

* cited by examiner

*Primary Examiner* — Michelle Mandala
*Assistant Examiner* — Jordan M Klein
(74) *Attorney, Agent, or Firm* — Kilpatrick Townsend & Stockton LLP

(57) ABSTRACT

A substrate structure includes a polycrystalline substrate, a plurality of thin film layers disposed on the polycrystalline substrate, a bonding layer coupled to at least a portion of the plurality of thin films, and a single crystal silicon layer joined to the bonding layer.

24 Claims, 13 Drawing Sheets

ALUMINUM NITRIDE BASED SILICON-ON-INSULATOR SUBSTRATE STRUCTURE

CROSS-REFERENCES TO RELATED APPLICATIONS

This application claims the benefit of U.S. Provisional Patent Application No. 62/314,557, filed on Mar. 29, 2016, and U.S. Provisional Patent Application No. 62/350,084, filed on Jun. 14, 2016, the contents of both applications are incorporated by reference in their entirety.

BACKGROUND OF THE INVENTION

Silicon-on-Insulator (SOI) lateral diffused MOSFETs (LDMOSFETs) are increasingly used as output power devices in RF power amplifiers for base stations for high power output with a drain to source breakdown voltage of 60 V. Such applications require supply voltages of 7 V to 36 V, frequency range of 1 MHz to 2 GHz, and a high peak power of 350 W. SOI provides an advantage of providing high resistivity substrate capabilities (as high as 10 kOhm-cm), leading to substantially reduced RF losses. In addition, SOI provides superior isolation, reduced parasitic capacitances, and leakage currents compared to conventional technologies. The insulator layer in the SOI structure is usually $SiO_2$. Thus, the thermal performance of the SOI structure is limited by the thermal conductivity (TC) of $SiO_2$, which is 1.3 W/mK (including a 200 nm interface), often leading to self-heating in power devices. Thermal conductivity also shows an increase of about 10% over the range of 0-200° C. Therefore, improved SOI substrate structures are needed.

SUMMARY OF THE INVENTION

Embodiments of the present invention relate to semiconductor structures. More particularly, embodiments of the present invention provide a polycrystalline substrate supporting a silicon-on-insulator structure. In a particular embodiment, a polycrystalline aluminum nitride substrate is coated with multiple layers that support a single crystal silicon layer suitable for use in fabricating CMOS devices. The present invention is applicable to a range of structures suitable for CMOS and other semiconductor device manufacturing.

According to an embodiment of the present invention, a substrate structure includes: a polycrystalline substrate; a plurality of thin film layers disposed on the polycrystalline substrate; a bonding layer coupled to at least a portion of the plurality of thin films; and a single crystal silicon layer joined to the bonding layer.

According to another embodiment of the present invention, a method of fabricating a substrate structure includes: forming a support structure by providing a polycrystalline substrate, and forming a plurality of thin film layers on the polycrystalline substrate; forming a bonding layer coupled to at least a portion of the plurality of thin film layers; and joining a single crystal silicon layer to the bonding layer.

According to a further embodiment of the present invention, a device structure includes a support structure. The support structure includes: a polycrystalline ceramic core; a first adhesion layer coupled to the polycrystalline ceramic core; a conductive layer coupled to the first adhesion layer; a second adhesion layer coupled to the conductive layer; and a barrier layer coupled to the second adhesion layer. The device structure further includes a silicon oxide layer coupled to the support structure; a single crystal silicon layer coupled to the silicon oxide layer; and a plurality of laterally diffused MOSFET (LDMOS) devices coupled to the single crystal silicon layer.

Numerous benefits are achieved by way of the present invention over conventional techniques. For example, embodiments of the present invention provide enhanced thermal performance in comparison with conventional techniques, improving output power for a given die size, decreasing the die size, or both. Additionally, embodiments of the present invention enable a variety of applications including high voltage processes on SOI (for example, up to 750 V), automotive transceivers, and power integrated circuits, since these applications benefit from the electrical insulation and thermal conductivity properties of the polycrystalline substrates utilized in embodiments of the present invention. These and other embodiments of the invention along with many of its advantages and features are described in more detail in conjunction with the text below and attached figures.

DETAILED DESCRIPTION OF SPECIFIC EMBODIMENTS

As discussed above, the thermal performance of a conventional silicon-on-insulator (SOI) substrate structure is limited by the thermal conductivity (TC) of $SiO_2$, which is 1.3 W/mK, often leading to self-heating in power devices. Thermal conductivity also shows an increase of about 10% over the range of 0-200° C. To gain significantly higher thermal conductivity as compared to that of a conventional SOI substrate, substrate engineering can be utilized. For example, LDMOS on a SiC hybrid substrate has two to three times higher thermal conductivity than SOI. However, it is very difficult to create defect-free large diameter hybrid substrates and are very expensive. Thus, this approach does not lend itself as a viable manufacturing solution. Embodiments of the present invention provide ceramic substrates that enable defect-free, low bow, large diameter wafers in 6", 8", 12", and the like for a variety of interfaces such as silicon, silicon carbide, gallium nitride, and others in a cost effective manner.

As described herein, embodiments of the present invention provide an alternative to conventional SOI structures through the use of a polycrystalline substrate, for example, polycrystalline aluminum nitride (AlN), polycrystalline aluminum gallium nitride (AlGaN), polycrystalline gallium nitride (GaN), or polycrystalline silicon carbide (SiC), as a substrate.

The inventors have determined that polycrystalline AlN provides significant advantages over conventional materials including a thermal conductivity of 180 W/mK (it should be noted that the theoretical thermal conductivity is 280 W/mK), which can be compared to a thermal conductivity of ~1.3 W/mK for a silicon substrate, high electrical resistivity (e.g., $10^{14}$ ohm-cm), which can be compared to an electrical resistivity of $10^6$ ohm-cm for a silicon substrate, and a thermal expansion coefficient (CTE) of $4.6 \times 10^{-6}$, which is close to that of silicon. In comparison with conventional SOI structures, which can use silicon/oxide/single crystal silicon or sapphire/oxide/single crystal silicon structures for LDMOS fabrication, embodiments provide high thermal conductivity as noted above while providing high radiation resistance, electrical isolation from the substrate, and low RF signal absorption all at the same time.

Figure 1:
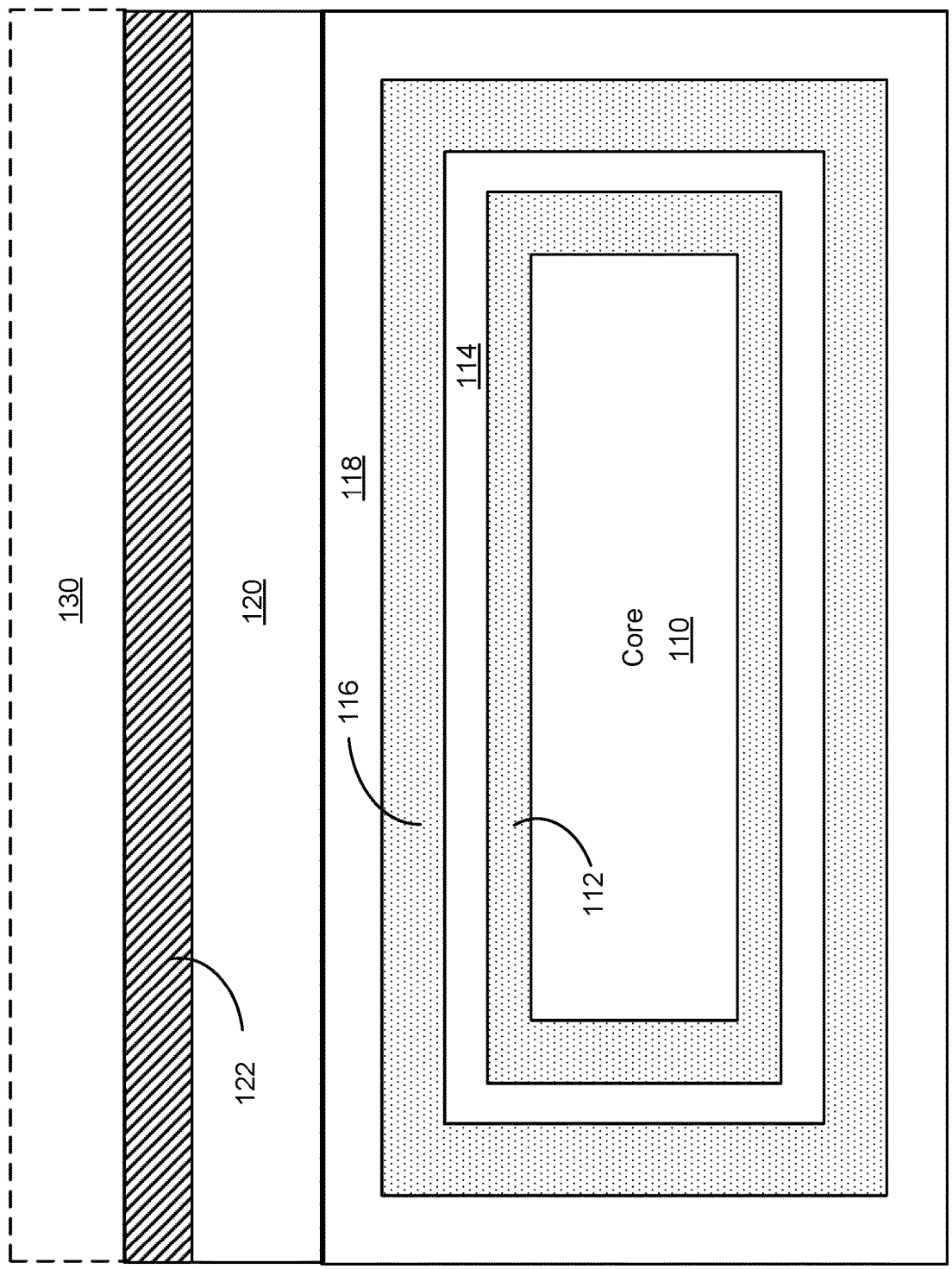
FIG. 1 is a simplified schematic diagram illustrating an engineered substrate structure according to an embodiment of the present invention.

FIG. 1 is a simplified schematic diagram illustrating an engineered substrate structure 100 according to an embodiment of the present invention. The engineered substrate 100 illustrated in FIG. 1 is suitable for a variety of electronic and optical applications. The engineered substrate 100 includes a core 110. The core 110 can include a polycrystalline ceramic material, for example, polycrystalline aluminum nitride (AlN), which can including a binding material such as yttrium oxide. Other materials can be utilized in the core 110, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core can be on the order of 100 to 1,500 µm, for example, 725 µm. The core 110 is encapsulated in an adhesion layer 112 that can be referred to as a shell or an encapsulating shell. In an embodiment, the adhesion layer 112 comprises a tetraethyl orthosilicate (TEOS) layer on the order of 1,000 Å in thickness. In other embodiments, the thickness of the adhesion layer varies, for example, from 100 Å to 2,000 Å. Although TEOS is utilized for adhesion layers in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. The adhesion layer 112 completely surrounds the core 110 in some embodiments to form a fully encapsulated core and can be formed using an LPCVD process. The adhesion layer provides a surface on which subsequent layers adhere to form elements of the engineered substrate structure.

In addition to the use of LPCVD processes, furnace-based processes, and the like to form the encapsulating adhesion layer, other semiconductor processes can be utilized according to embodiments of the present invention, including CVD processes or similar deposition processes. As an example, a deposition process that coats a portion of the core can be utilized, the core can be flipped over, and the deposition process could be repeated to coat additional portions of the core. Thus, although LPCVD techniques are utilized in some embodiments to provide a fully encapsulated structure, other film formation techniques can be utilized depending on the particular application.

A conductive layer 114 is formed surrounding the adhesion layer 112. In an embodiment, the conductive layer is a shell of polysilicon (i.e., polycrystalline silicon) that is formed surrounding the adhesion layer 112 since polysilicon can exhibit poor adhesion to ceramic materials. In embodiments in which the conductive layer is polysilicon, the thickness of the polysilicon layer can be on the order of 500-5,000 Å, for example, 2,500 Å. In some embodiments, the polysilicon layer can be formed as a shell to completely surround the adhesion layer (e.g., a TEOS oxide layer), thereby forming a fully encapsulated adhesion layer, and can be formed using an LPCVD process. In other embodiments, as discussed below, the conductive material can be formed on a portion of the adhesion layer, for example, a lower half of the substrate structure. In some embodiments, conductive material can be formed as a fully encapsulating layer and subsequently removed on one side of the substrate structure.

In an embodiment, the conductive layer can be a polysilicon layer 114 doped to provide a highly conductive material, for example, doped with boron to provide a p-type polysilicon layer. In some embodiments, the doping with boron is at a level of $1 \times 10^{19}$ $cm^{-3}$ to $1 \times 10^{20}$ $cm^{-3}$ to provide for high conductivity. Other dopants at different dopant concentrations (e.g., phosphorus, arsenic, bismuth, or the like at dopant concentrations ranging from $1 \times 10^{16}$ $cm^{-3}$ to $5 \times 10^{18}$ $cm^{-3}$) can be utilized to provide either n-type or p-type semiconductor materials suitable for use in the conductive layer. One of ordinary skill in the art would recognize many variations, modifications, and alternatives.

The presence of the conductive layer is useful during electrostatic chucking of the engineered substrate to semiconductor processing tools, for example tools with electrostatic chucks (ESC). The conductive layer enables rapid dechucking after processing in the semiconductor processing tools. Thus, embodiments of the present invention provide substrate structures that can be processed in manners utilized with conventional silicon wafers. One of ordinary skill in the art would recognize many variations, modifications, and alternatives.

A second adhesion layer 116 (e.g., a TEOS layer on the order of 1,000 Å in thickness) 116 is formed surrounding the conductive layer 114. The second adhesion layer 116 completely surrounds the conductive layer 114 in some embodiments to form a fully encapsulated structure and can be formed using an LPCVD process, a CVD process, or any other suitable deposition process, including the deposition of a spin-on dielectric.

A barrier layer 118, for example, a silicon nitride layer, is formed surrounding the second adhesion layer 116. In an embodiment, the barrier layer is a silicon nitride layer 118 that is on the order of 4,000 Å to 5,000 Å in thickness. The barrier layer 118 completely surrounds the second adhesion layer 116 in some embodiments to form a fully encapsulated structure and can be formed using an LPCVD process. In addition to silicon nitride layers, amorphous materials including SiCN, SiON, AlN, SiC, and the like can be utilized as barrier layers. In some implementations, the barrier layer consists of a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer, e.g., a silicon nitride layer, prevents diffusion and/or outgassing of elements present in the core 110, for example, yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

A bonding layer 120 (e.g., a silicon oxide layer) is deposited on a portion of the barrier layer 118, for example, the top surface of the barrier layer, and subsequently used during the bonding of a single crystal silicon layer 122. The bonding layer 120 can be approximately 1.5 µm in thickness in some embodiments.

Figure 2A:
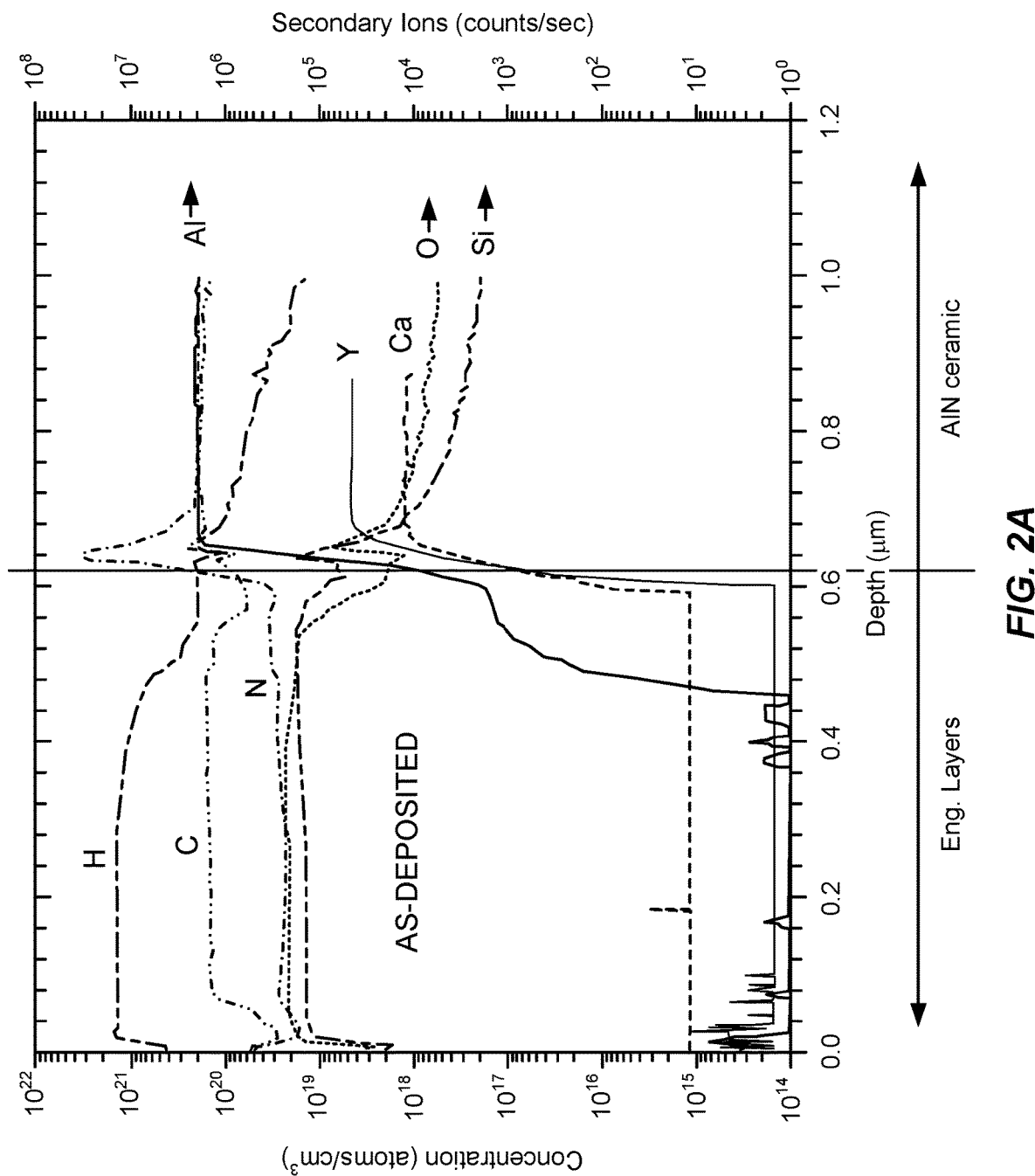
FIG. 2A is a secondary ion mass spectroscopy (SIMS) profile illustrating species concentration as a function of depth for an engineered substrate structure according to an embodiment of the present invention.

FIG. 2A is a secondary ion mass spectroscopy (SIMS) profile illustrating species concentration as a function of depth for an engineered structure according to an embodiment of the present invention. The engineered structure did not include barrier layer 118. Referring to FIG. 2A, several species present in the ceramic core (e.g., yttrium, calcium, and aluminum) drop to negligible concentrations in the engineered layers 120/122. The concentrations of calcium, yttrium, and aluminum drop by three, four, and six orders of magnitude, respectively.

Figure 2B:
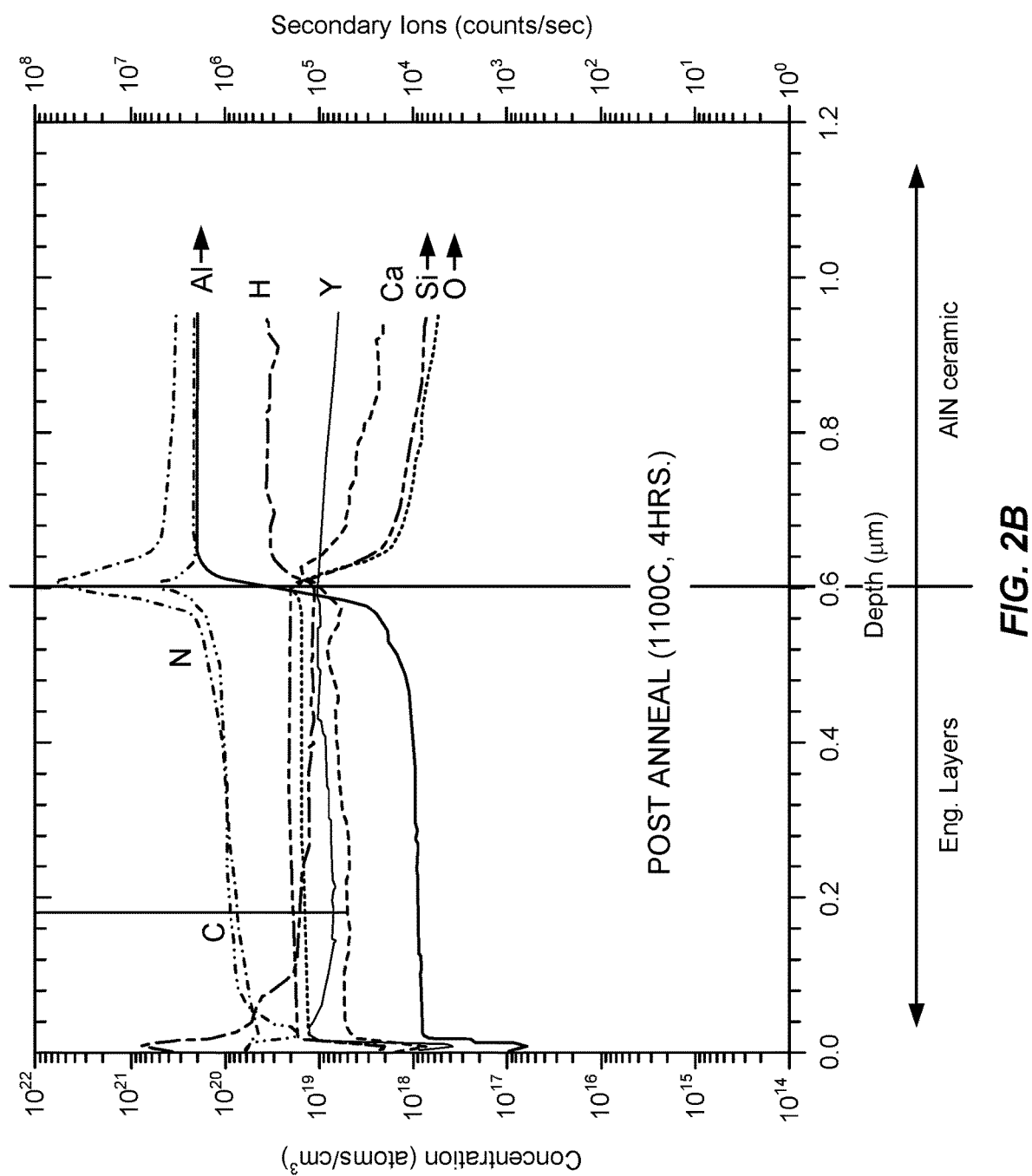
FIG. 2B is a SIMS profile illustrating species concentration as a function of depth for an engineered substrate structure after anneal according to an embodiment of the present invention.

FIG. 2B is a SIMS profile illustrating species concentration as a function of depth for an engineered structure without a barrier layer after anneal according to an embodiment of the present invention. The engineered substrate structure was annealed at 1,100° C. for a period of four hours. As shown by FIG. 2B, calcium, yttrium, and aluminum, originally present in low concentrations in the as deposited sample, have diffused into the engineered layers, reaching concentrations similar to other elements.

As discussed above, during semiconductor processing operations, the engineered substrate structures provided by embodiments of the present invention can be exposed to high temperatures (~1,100° C.) for several hours, for example, during epitaxial growth of GaN-based layers. Accordingly, embodiments of the present invention integrate a barrier layer (e.g., a silicon nitride layer) to prevent out-diffusion of the background elements from the polycrystalline ceramic material (e.g., AlN) into the engineered layers 120/122 and epitaxial layers such as optional GaN layer 130. The silicon nitride layer 118 encapsulating the underlying layers and material provides the desired barrier layer functionality.

Figure 2C:
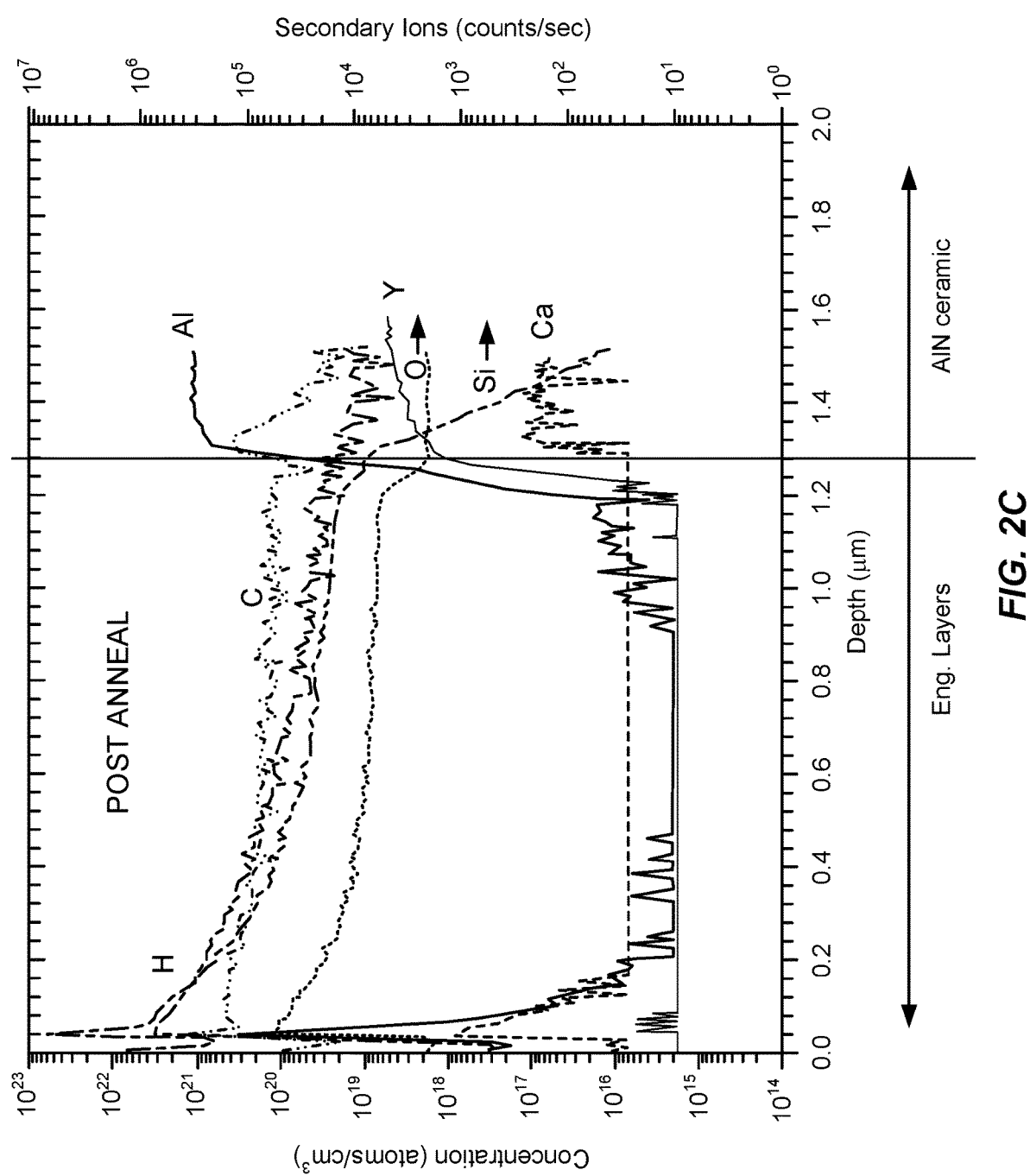
FIG. 2C is a SIMS profile illustrating species concentration as a function of depth for an engineered substrate structure with a silicon nitride layer after anneal according to an embodiment of the present invention.

FIG. 2C is a SIMS profile illustrating species concentration as a function of depth for an engineered structure with a barrier layer after anneal according to an embodiment of the present invention. The integration of the diffusion barrier layer 118 (e.g., a silicon nitride layer) into the engineered substrate structure prevents the diffusion of calcium, yttrium, and aluminum into the engineered layers during the annealing process that occurred when the diffusion barrier layer was not present. As illustrated in FIG. 2C, calcium, yttrium, and aluminum present in the ceramic core remain at low concentrations in the engineered layers post-anneal. Thus, the use of the barrier layer 118 (e.g., a silicon nitride layer) prevents these elements from diffusing through the diffusion barrier and thereby prevents their release into the environment surrounding the engineered substrate. Similarly, any other impurities containing within the bulk ceramic material would be contained by the barrier layer.

Typically, ceramic materials utilized to form the core 110 are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 118 into the engineered substrate to prevent this undesirable diffusion.

As illustrated in FIG. 2B, elements originally present in the core 110, including yttrium diffuse into and through the first TEOS layer 112, the polysilicon layer 114, and the second TEOS layer 116. However, the presence of the silicon nitride layer 118 prevents these elements from diffusing through the silicon nitride layer and thereby prevents their release into the environment surrounding the engineered substrate.

Figure 3:
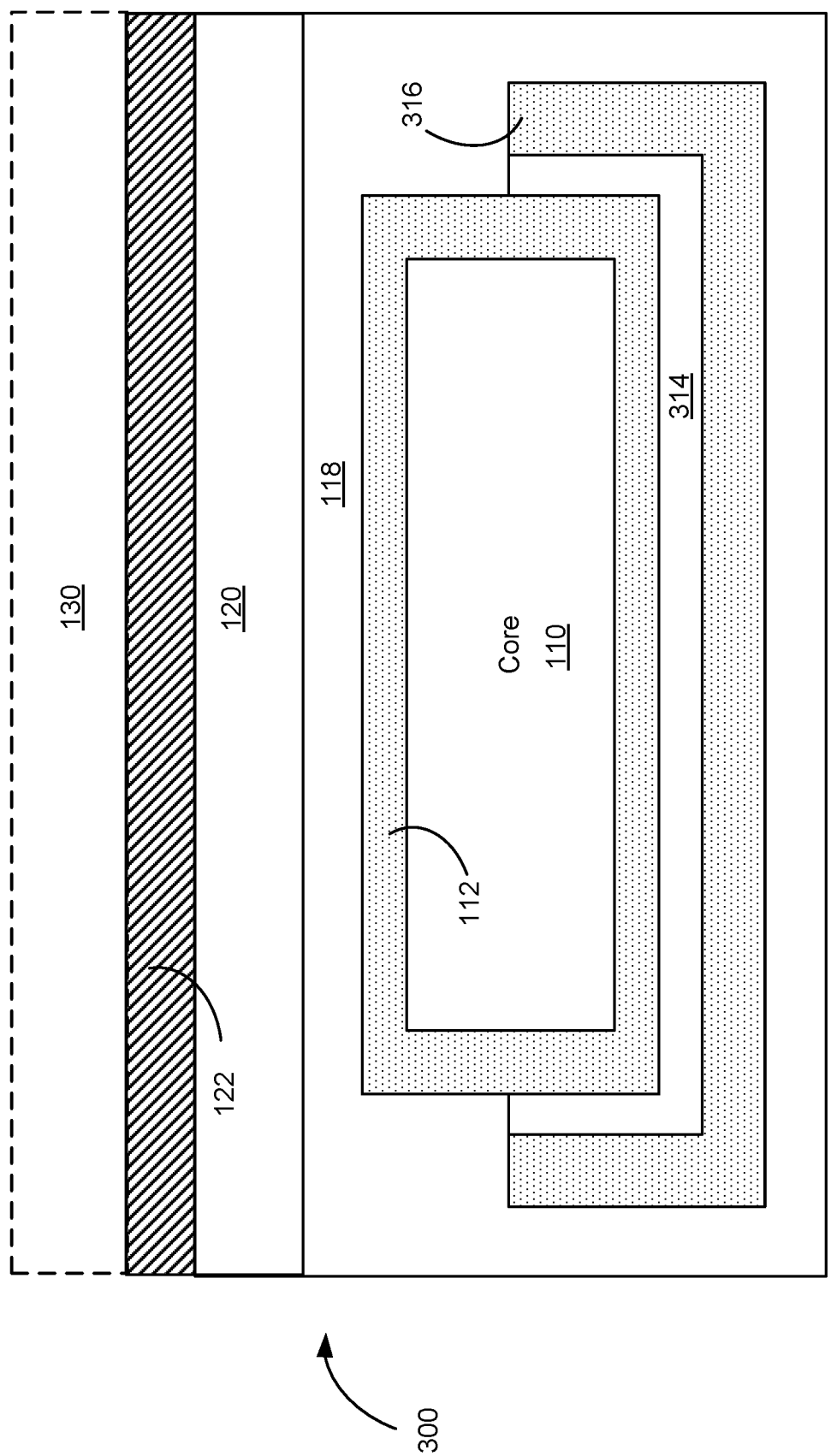
FIG. 3 is a simplified schematic diagram illustrating an engineered substrate structure according to another embodiment of the present invention.

FIG. 3 is a simplified schematic diagram illustrating an engineered substrate structure 300 according to an embodiment of the present invention. The engineered substrate structure 300 includes a core 110. The core 110 can be a polycrystalline ceramic material, for example, polycrystalline aluminum nitride (AlN). The thickness of the core can be on the order of 100 to 1,500 µm, for example, 725 µm. The core 110 is encapsulated in an adhesion layer 112 that can be referred to as a shell or an encapsulating shell. In this implementation, the adhesion layer 312 completely encapsulates the core, but this is not required by the present invention, as discussed in additional detail with respect to FIG. 4.

In an embodiment, the adhesion layer 112 comprises a tetraethyl orthosilicate (TEOS) layer on the order of 1,000 Å in thickness. In other embodiments, the thickness of the adhesion layer varies, for example, from 100 Å to 2,000 Å.

Although TEOS is utilized for adhesion layers in some embodiments, other materials that provide for adhesion between later deposited layers and underlying layers or materials can be utilized according to an embodiment of the present invention. For example, $SiO_2$, SiON, and the like adhere well to ceramic materials and provide a suitable surface for subsequent deposition, for example, of conductive materials. The adhesion layer 112 completely surrounds the core 110 in some embodiments to form a fully encapsulated core and can be formed using an LPCVD process. The adhesion layer provides a surface on which subsequent layers adhere to form elements of the engineered substrate structure.

In addition to the use of LPCVD processes, furnace-based processes, and the like to form the encapsulating adhesion layer, other semiconductor processes can be utilized according to embodiments of the present invention. As an example, a deposition process, for example, CVD, PECVD, or the like, that coats a portion of the core can be utilized, the core can be flipped over, and the deposition process could be repeated to coat additional portions of the core.

A conductive layer 314 is formed on at least a portion of the adhesion layer 112. In an embodiment, the conductive layer includes polysilicon (i.e., polycrystalline silicon) that is formed by a deposition process on a lower portion (e.g., the lower half or backside) of the core/adhesion layer structure. In embodiments in which the conductive layer is polysilicon, the thickness of the polysilicon layer can be on the order of a few thousand angstroms, for example, 3,000 Å. In some embodiments, the polysilicon layer can be formed using an LPCVD process.

In an embodiment, the conductive layer can be a polysilicon layer 314 doped to provide a highly conductive material, for example, the conductive layer can be doped with boron to provide a p-type polysilicon layer. In some embodiments, the doping with boron is at a level ranging from about $1\times10^{19}$ cm$^{-3}$ to $1\times10^{20}$ cm$^{-3}$ to provide for high conductivity. The presence of the conductive layer is useful during electrostatic chucking of the engineered substrate to semiconductor processing tools, for example tools with electrostatic chucks (ESC). The conductive layer enables rapid dechucking after processing. Thus, embodiments of the present invention provide substrate structures that can be processed in manners utilized with conventional silicon wafers. One of ordinary skill in the art would recognize many variations, modifications, and alternatives.

A second adhesion layer 316 (e.g., a second TEOS oxide layer) is formed surrounding the conductive layer 314 (e.g., a polysilicon layer). The second adhesion layer 316 is on the order of 1,000 Å in thickness. The second adhesion layer 316 completely surrounds the conductive layer 314 in some embodiments to form a fully encapsulated structure and can be formed using an LPCVD process.

A barrier layer 118 (e.g., a silicon nitride layer) is formed surrounding the second adhesion layer 316. The barrier layer 118 is on the order of 4,000 Å to 5,000 Å in thickness in some embodiments. The barrier layer 118 completely surrounds the second adhesion layer 316 in some embodiments to form a fully encapsulated structure and can be formed using an LPCVD process.

In some embodiments, the use of a silicon nitride barrier layer prevents diffusion and/or outgassing of elements present in the core 110, for example, yttrium oxide (i.e., yttria), oxygen, metallic impurities, other trace elements and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments can be utilized in semiconductor process flows and clean room environments.

Figure 4:
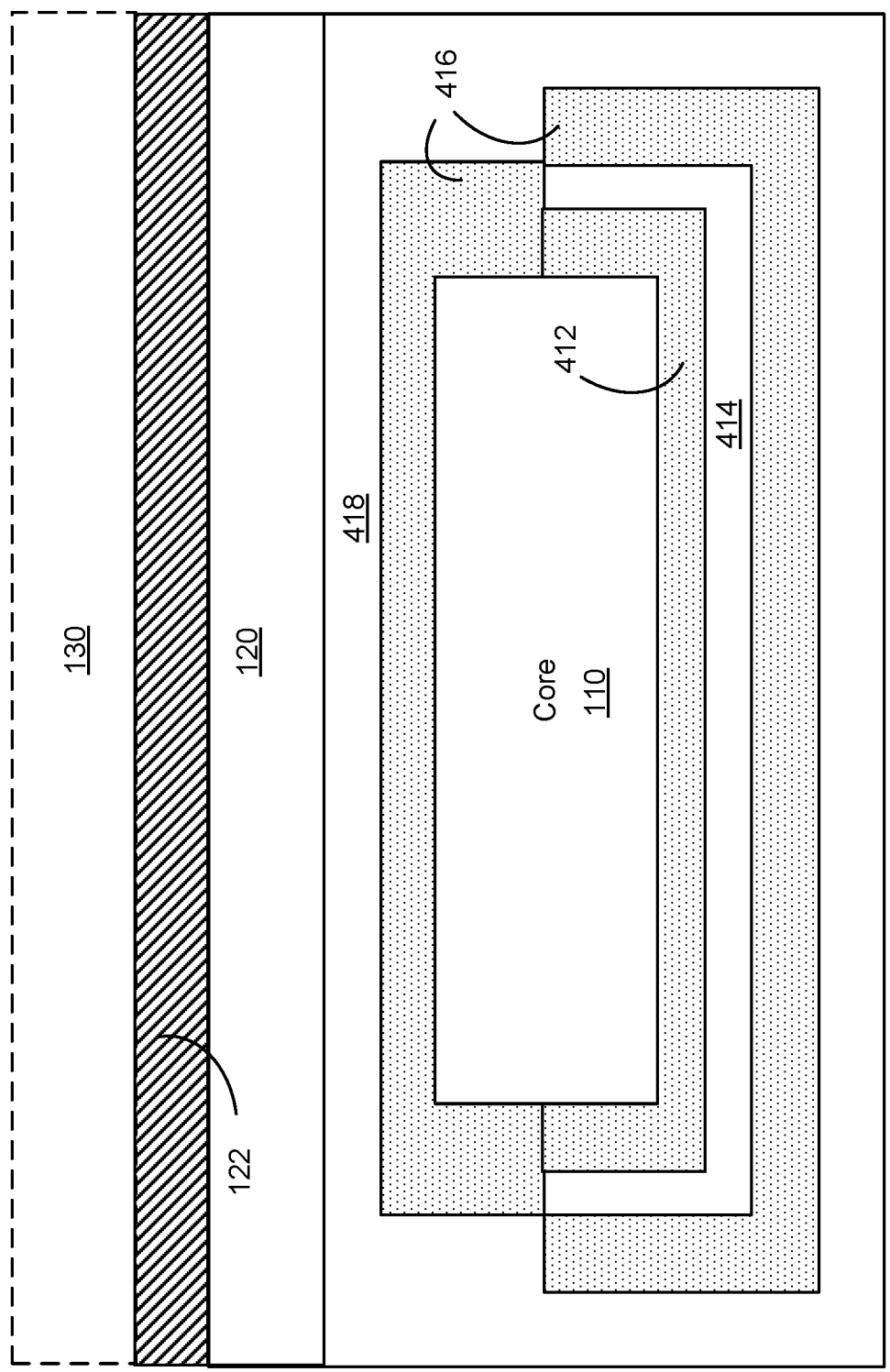
FIG. 4 is a simplified schematic diagram illustrating an engineered substrate structure according to yet another embodiment of the present invention.

FIG. 4 is a simplified schematic diagram illustrating an engineered substrate structure 400 according to another embodiment of the present invention. In the embodiment illustrated in FIG. 4, the adhesion layer 412 is formed on at least a portion of the core 110, but does not encapsulate the core. In this implementation, the adhesion layer 412 is formed on a lower surface of the core (the backside of the core) in order to enhance the adhesion of a subsequently formed conductive layer 414 as described more fully below. Although adhesion layer 412 is only illustrated on the lower surface of the core in FIG. 4, it will be appreciated that deposition of adhesion layer material on other portions of the core will not adversely impact the performance of the engineered substrates structure and such material can be present in various embodiments. One of ordinary skill in the art would recognize many variations, modifications, and alternatives.

The conductive layer 414, rather than being formed as a shell as illustrated in FIG. 3, does not encapsulate the adhesion layer 412 and core 110, but is substantially aligned with the adhesion layer 412. Although the conductive layer 414 is illustrated as extending along the bottom or backside and up a portion of the sides of the adhesion layer 412, this is not required by the present invention. Thus, embodiments can utilize deposition on one side of the substrate structure, masking of one side of the substrate structure, or the like. The conductive layer 414 can be formed on a portion of one side, for example, the bottom/backside, of the adhesion layer 412. The conductive 414 layer provides for electrical conduction on one side of the engineered substrate structure, which can be advantageous in RF and high power applications. The conductive layer can include doped polysilicon as discussed in relation to conductive layer 114 in FIG. 1.

Portion of the core 110, portions of the adhesion layer 412, and the conductive layer 414 are covered with a second adhesion layer 416 in order to enhance the adhesion of the barrier layer 418 to the underlying materials. The barrier layer 418 forms an encapsulating structure to prevent diffusion from underlying layers are discussed above.

In addition to semiconductor-based conductive layers, in other embodiments, the conductive layer 414 is a metallic layer, for example, 500 Å of titanium, or the like.

Referring once again to FIG. 4, depending on the implementation, one or more layers may be removed. For example, layers 412 and 414 can be removed, only leaving single adhesion shell 416 and barrier layer 418. In another embodiment, only layer 414 can be removed, leaving single adhesion layer 412 underneath the barrier layer 416. In this embodiment, layer 412 may also balance the stress and the wafer bow induced by layer 120, deposited on top of layer 418. The construction of a substrate structure with insulating layers on the top side of Core 110 (e.g., with only insulating layer between core 110 and layer 120) will provide benefits for power/RF applications, where a highly insulating substrate is desirable.

In another embodiment, barrier layer 418 may directly encapsulate core 110, followed by conductive layer 414 and subsequent adhesion layer 416. In this embodiment, layer 120 may be directly deposited onto adhesion layer 416 from the top side. In yet another embodiment, adhesion layer 416 may be deposited on core 110, followed by a barrier layer 418, and then followed by conductive layer 414, and another adhesion layer 412.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

Figure 5:
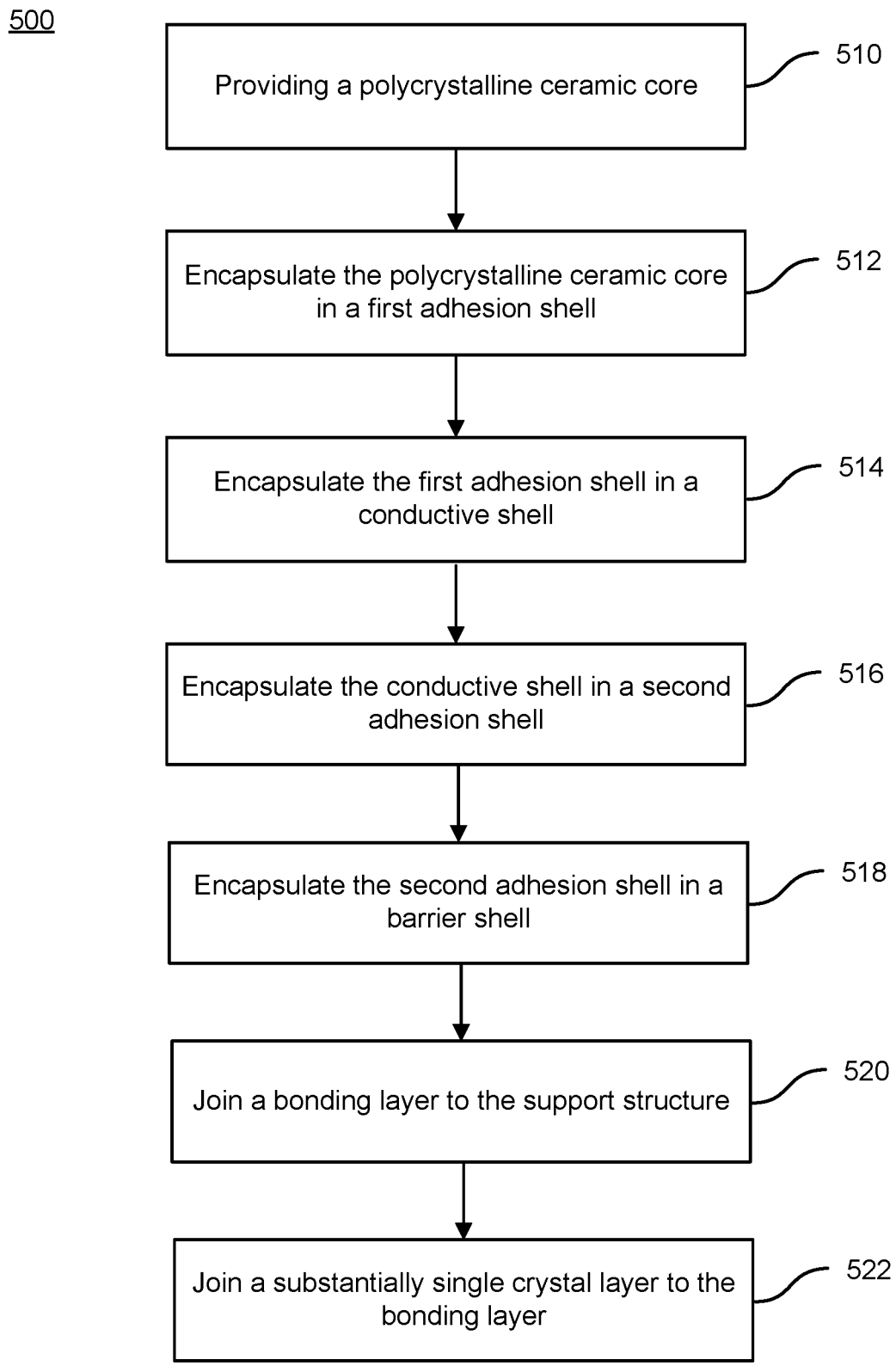
FIG. 5 is a simplified flowchart illustrating a method of fabricating an engineered substrate structure according to an embodiment of the present invention.

FIG. 5 is a simplified flowchart illustrating a method 500 of fabricating an engineered substrate structure according to an embodiment of the present invention. The method 500 includes forming a support structure by providing a polycrystalline ceramic core (510), encapsulating the polycrystalline ceramic core in a first adhesion layer forming a shell (512) (e.g., a tetraethyl orthosilicate (TEOS) shell), and encapsulating the first adhesion layer in a conductive shell (514) (e.g., a polysilicon shell). The first adhesion layer can be formed as a single layer of TEOS. The conductive shell can be formed as a single layer of polysilicon.

The method also includes encapsulating the conductive shell in a second adhesion layer (516) (e.g., a second TEOS shell) and encapsulating the second adhesion layer in a barrier layer shell (518). The second adhesion layer can be formed as a single layer of TEOS. The barrier layer shell can be formed as a single layer of silicon nitride.

Once the support structure is formed by processes 510-518, the method further includes joining a bonding layer (e.g., a silicon oxide layer) to the support structure (520) and joining a substantially single crystal layer, for example, a single crystal silicon layer, to the silicon oxide layer (522). Other substantially single crystal layers can be used according to embodiments of the present invention, including SiC, sapphire, GaN, AlN, SiGe, Ge, Diamond, $Ga_2O_3$, ZnO, and the like. The joining of the bonding layer can include deposition of a bonding material followed by planarization processes as described herein. In an embodiment as described below, joining the substantially single crystal layer (e.g., a single crystal silicon layer) to the bonding layer utilizes a layer transfer process in which the layer is a single crystal silicon layer that is transferred from a silicon wafer.

Referring to FIG. 1, the bonding layer 120 can be formed by a deposition of a thick (e.g., 4 μm thick) oxide layer followed by a chemical mechanical polishing (CMP) process to thin the oxide to approximately 1.5 μm in thickness. The thick initial oxide serves to fill voids and surface features present on the support structure that may be present after fabrication of the polycrystalline core and continue to be present as the encapsulating layers illustrated in FIG. 1 are formed. The CMP process provides a substantially planar surface free of voids, particles, or other features, which can then be used during a wafer transfer process to bond the substantially single crystal layer 122 (e.g., a single crystal silicon layer) to the bonding layer 120. It will be appreciated that the bonding layer does not have to be characterized by an atomically flat surface, but should provide a substantially planar surface that will support bonding of the substantially single crystal layer (e.g., a single crystal silicon layer) with the desired reliability.

A layer transfer process is used to join the substantially single crystal layer 122 (e.g., a single crystal silicon layer) to the bonding layer 120. In some embodiments, a silicon wafer including the substantially single crystal layer 122 (e.g., a single crystal silicon layer) is implanted to form a cleavage plane. In this embodiment, after wafer bonding, the silicon substrate can be removed along with the portion of the single crystal silicon layer below the cleavage plane, resulting in an exfoliated single crystal silicon layer. One of ordinary skill in the art would recognize many variations, modifications, and alternatives.

It should be appreciated that the specific steps illustrated in FIG. 5 provide a particular method of fabricating an engineered substrate structure according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
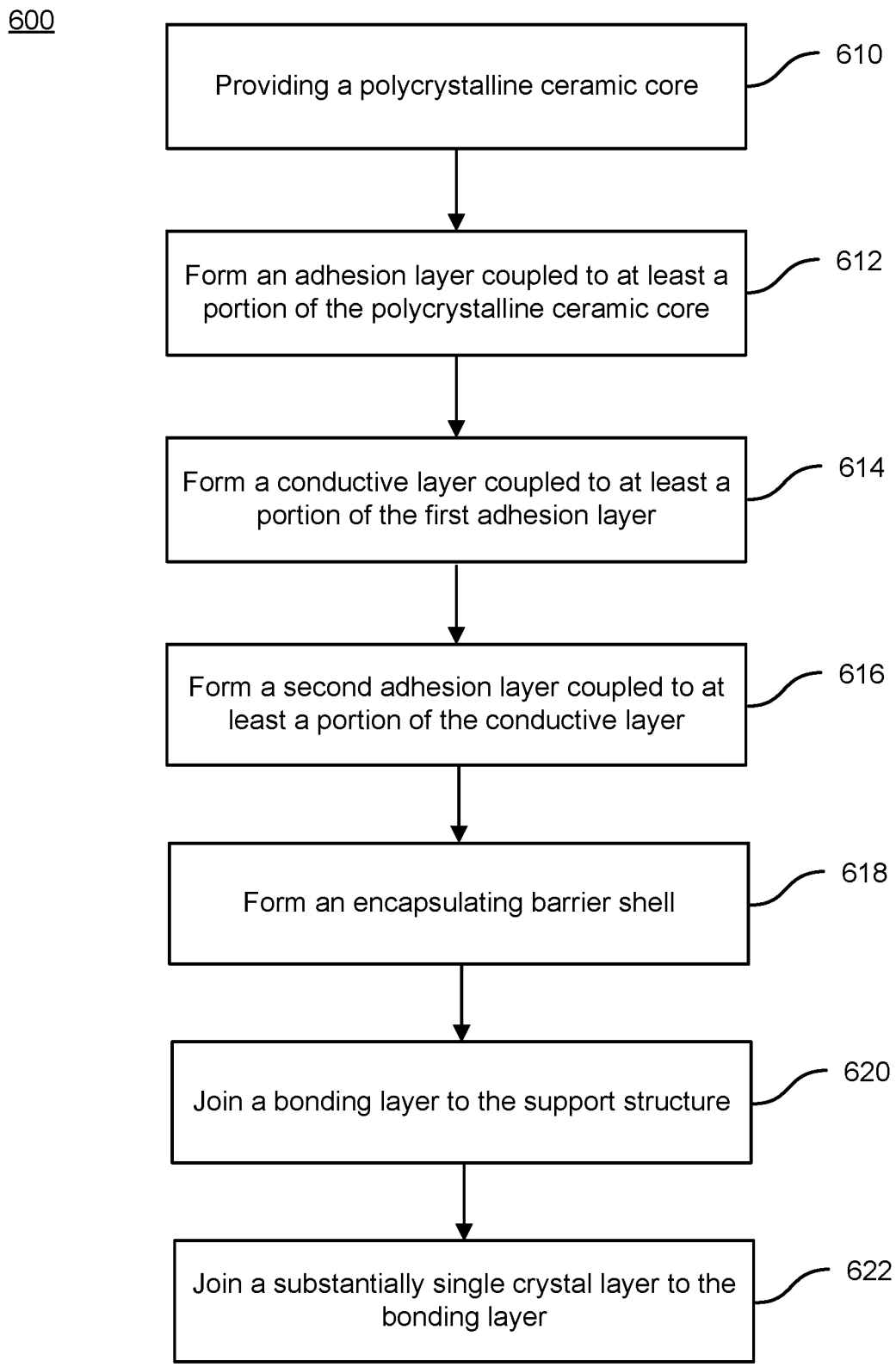
FIG. 6 is a simplified flowchart illustrating a method of fabricating an engineered substrate structure according to another embodiment of the present invention.

FIG. 6 is a simplified flowchart illustrating a method 600 of fabricating an engineered substrate structure according to another embodiment of the present invention. The method 600 includes forming a support structure by providing a polycrystalline ceramic core (610), forming an adhesion layer coupled to at least a portion of the polycrystalline ceramic core (612). The first adhesion layer can include a tetraethyl orthosilicate (TEOS) layer. The method also includes forming a conductive layer coupled to the first adhesion layer (614). The conductive layer can be a polysilicon layer. The first adhesion layer can be formed as a single layer of TEOS. The conductive layer can be formed as a single layer of polysilicon.

The method also includes forming a second adhesion layer coupled to at least a portion of the first adhesion layer (616) and forming a barrier shell (618). The second adhesion layer can be formed as a single layer of TEOS. The barrier shell can be formed as a single layer of silicon nitride or a series of sub-layers forming the barrier shell.

Once the support structure is formed by processes 610-618, the method further includes joining a bonding layer (e.g., a silicon oxide layer) to the support structure (620) and joining a single crystal silicon layer or a substantially single crystal layer to the silicon oxide layer (622). The joining of the bonding layer can include deposition of a bonding material followed by planarization processes as described herein. In an embodiment as described below, joining the single crystal silicon layer to the bonding utilizes a layer transfer process in which the single crystal silicon layer is transferred from a silicon wafer.

It should be appreciated that the specific steps illustrated in FIG. 6 provide a particular method of fabricating an engineered substrate structure according to another embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
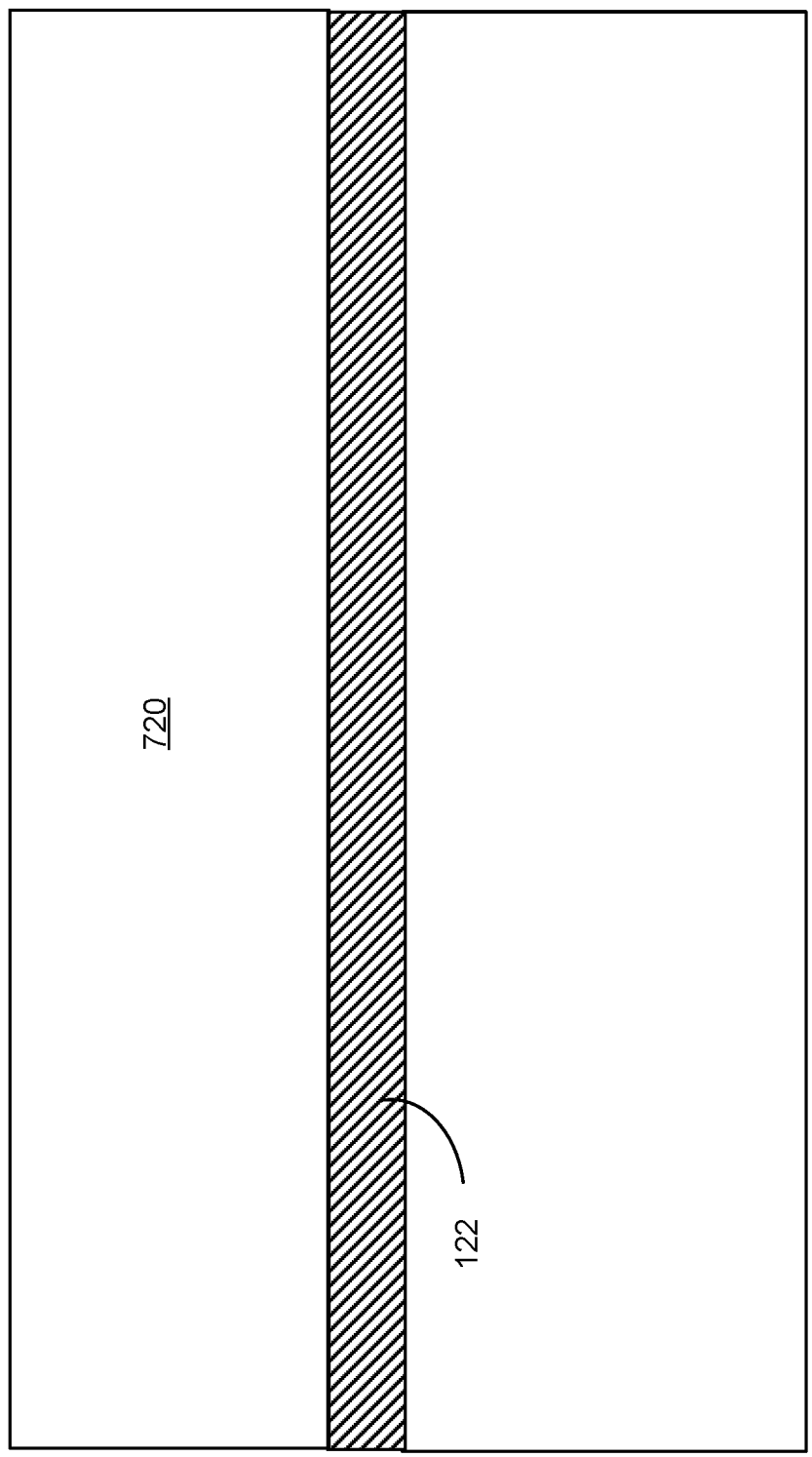
FIG. 7 is a simplified schematic diagram illustrating an epitaxial/engineered substrate structure for RF and power applications according to an embodiment of the present invention.

FIG. 7 is a simplified schematic diagram illustrating an epitaxial/engineered substrate structure for RF and power applications according to an embodiment of the present invention. In some LED applications, the engineered substrate structure provides a growth substrate that enables the growth of high quality GaN layers and the engineered substrate structure is subsequently removed. However, for RF and power device applications, the engineered substrate structure forms portions of the finished device and as a result, the electrical, thermal, and other properties of the engineered substrate structure or elements of the engineered substrate structure are important to the particular application.

Referring to FIG. 1, the single crystal silicon layer 122 is typically an exfoliated layer split from a silicon donor wafer using an implant and exfoliation technique. Typical implants are hydrogen and boron. For power and RF device applications, the electrical properties of the layers and materials in the engineered substrate structure are of importance. For example, some device architectures utilize highly insulating silicon layers with resistance greater than $10^3$ Ohm-cm to reduce or eliminate leakage through the substrate and interface layers. Other applications utilized designs that include a conductive silicon layer of a predetermined thickness (e.g., 1 μm) in order to connect the source of the device to other elements. Thus, in these applications, control of the dimensions and properties of the single crystal silicon layer is desirable. In design in which implant and exfoliation techniques are used during layer transfer, residual implant atoms, for example, hydrogen or boron, are present in the silicon layer, thereby altering the electrical properties. Additionally, it can be difficult to control the thickness, conductivity, and other properties of thin silicon layers, using, for example, adjustments in the implant dose, which can impact conductivity, and implant depth, which can impact layer thickness.

According to embodiments of the present invention, silicon epitaxy on an engineered substrate structure is utilized to achieve desired properties for the single crystal silicon layer as appropriate to particular device designs.

Referring to FIG. 7, the epitaxial/engineered substrate structure 710 includes an engineered substrate structure 710 and a silicon epitaxial layer 720 formed thereon. The engineered substrate structure 710 can be similar to the engineered substrate structures illustrated in FIGS. 1, 3, and 4. Typically, the single crystal silicon layer 122 is on the order of 0.5 μm after layer transfer. Surface conditioning processes can be utilized to reduce the thickness of the single crystal silicon layer 122 to about 0.3 μm in some processes. In order to increase the thickness of the single crystal silicon layer to about 1 μm for use in making reliable ohmic contacts, for example, an epitaxial process is used to grow epitaxial single crystal silicon layer 722 on the single crystal silicon layer 122 formed by the layer transfer process. A variety of epitaxial growth processes can be used to grow epitaxial single crystal silicon layer 722, including CVD, LPCVD, ALD, MBE, or the like. The thickness of the epitaxial single crystal silicon layer 722 can range from about 0.1 μm to about 20 μm, for example between 0.1 μm and 10 μm.

Figure 8:
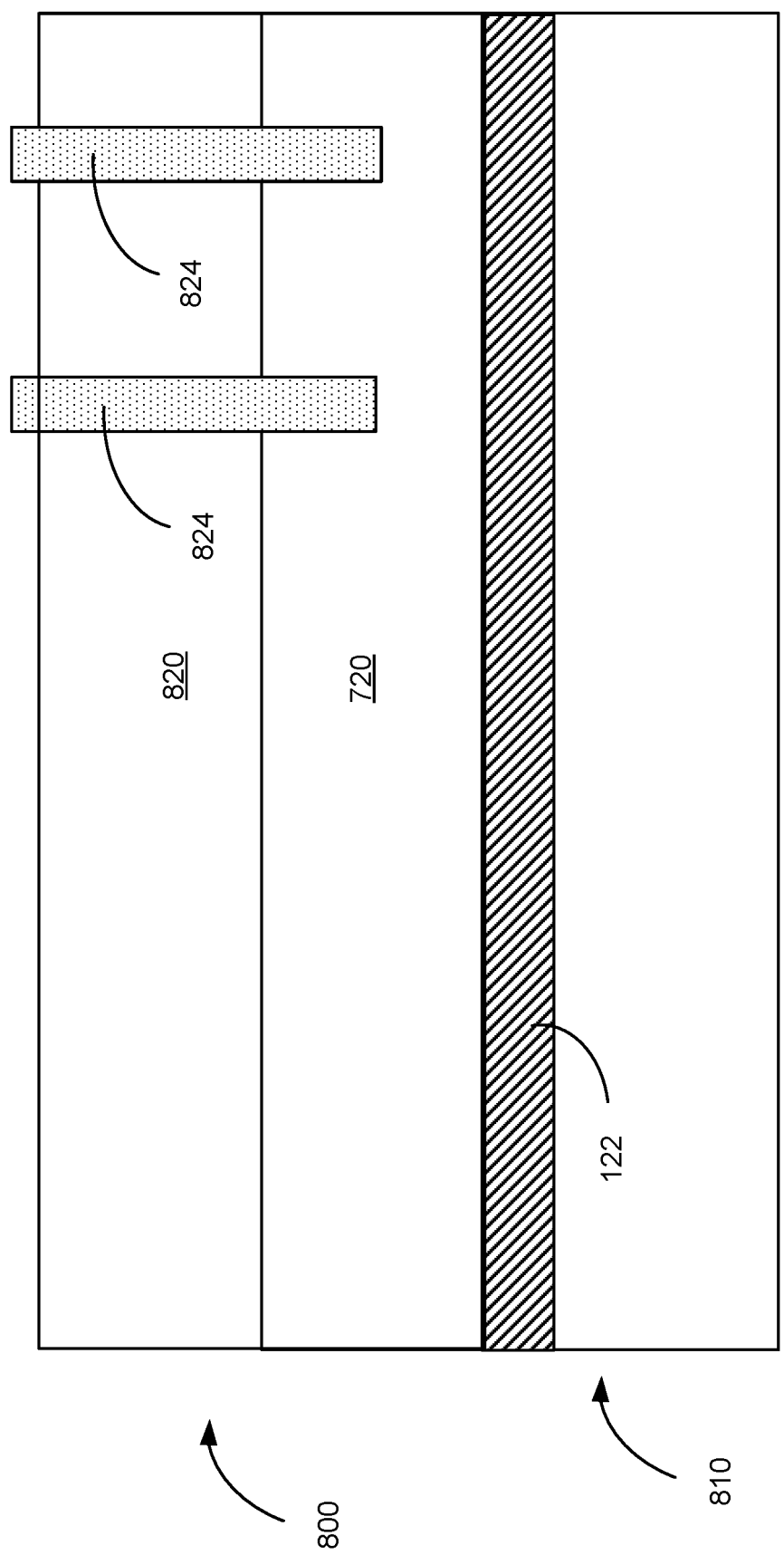
FIG. 8 is a simplified schematic diagram illustrating a III-V epitaxial layer on an engineered substrate structure according to an embodiment of the present invention.

FIG. 8 is a simplified schematic diagram illustrating a III-V epitaxial layer on an engineered substrate structure according to an embodiment of the present invention. The structure illustrated in FIG. 8 can be referred to as a double epitaxial structure as described below. As illustrated in FIG. 8, an engineered substrate structure 810 including an epitaxial single crystal silicon layer 720 has a III-V epitaxial layer 820 formed thereon. In an embodiment, the III-V epitaxial layer comprises gallium nitride (GaN). In order to provide for electrical conductivity between portions of the III-V epitaxial layer, which can include multiple sub-layers, a set of vias 824 are formed passing, in this example, from a top surface of the III-V epitaxial layer 820, through the epitaxial single crystal silicon layer 720, into the single crystal silicon layer 122. As an example, these vias could be used to connect an electrode of a diode or a transistor to the underlying silicon layer by providing an ohmic contact through the vias, thereby relaxing charge build up in the device.

If the III-V epitaxial layer were grown on the single crystal silicon layer 122, it would be difficult to make such an ohmic contact through the vias since terminating the via etch in the single crystal silicon layer 122 would be difficult: for example, etching through 5 μm of GaN and terminating the etch in a 0.3 μm silicon layer reliably across an entire wafer. Utilizing embodiments of the present invention, it is possible to provide single crystal silicon layers multiple microns in thickness, which is difficult using implant and exfoliation processes since achieving large implant depth requires high implant energy. In turn, the thick silicon layers enable applications such as the illustrated vias that enable a wide variety of device designs.

In addition to increasing the thickness of the silicon "layer" by epitaxially growing the single crystal silicon layer 720 on the single crystal silicon layer 122, other adjustments can be made to the original properties of the single crystal silicon layer 122, including modifications of the conductivity, crystallinity, and the like. For example, if a silicon layer on the order of 10 μm is desired before additional epitaxial growth of III-V layers or other materials, such a thick layer can be grown according to embodiments of the present invention.

Because the implant process can impact the properties of the single crystal silicon layer 122, for example, residual boron/hydrogen atoms can influence the electrical properties of the silicon, embodiments of the present invention remove a portion of the single crystal silicon layer 122 prior to epitaxial growth of single crystal silicon layer 720. For example, the single crystal silicon layer 122 can be thinned to form a layer 0.1 μm in thickness or less, removing most or all of the residual boron/hydrogen atoms. Subsequent growth of single crystal silicon layer 720 is then used to provide a single crystal material with electrical and/or other properties substantially independent of the corresponding properties of the layer formed using layer transfer processes.

In addition to increasing the thickness of the single crystal silicon material coupled to the engineered substrate structure, the electrical properties including the conductivity of the epitaxial single crystal silicon layer 720 can be different from that of the single crystal silicon layer 122. Doping of the epitaxial single crystal silicon layer 720 during growth can produce p-type silicon by doping with boron and n-type silicon by doping with phosphorus. Undoped silicon can be grown to provide high resistivity silicon used in devices that have insulating regions. Insulating layers can be of use in RF devices, in particular.

The lattice constant of the epitaxial single crystal silicon layer 720 can be adjusted during growth to vary from the lattice constant of the single crystal silicon layer 122 to produce strained epitaxial material. In addition to silicon, other elements can be grown epitaxially to provide layers, including strained layers, that include silicon germanium, or the like. Additionally, the crystal orientation of the crystal planes, for example growth of (111) silicon on (100) silicon, can be utilized to introduce strain. For instance, buffer layers can be grown on the single crystal silicon layer 122, on the epitaxial single crystal silicon layer 720, or between layers to enhance subsequent epitaxial growth. These buffer layers could include strained III-V layers, silicon germanium strained layers, and the like. Additionally, the buffer layers and other epitaxial layers can be graded in mole fraction, dopants, polarity, or the like. One of ordinary skill in the art would recognize many variations, modifications, and alternatives.

In some embodiments, strain present in the single crystal silicon layer 122 or the epitaxial single crystal silicon layer 720 may be relaxed during growth of subsequent epitaxial layers, including III-V epitaxial layers.

Figure 9:
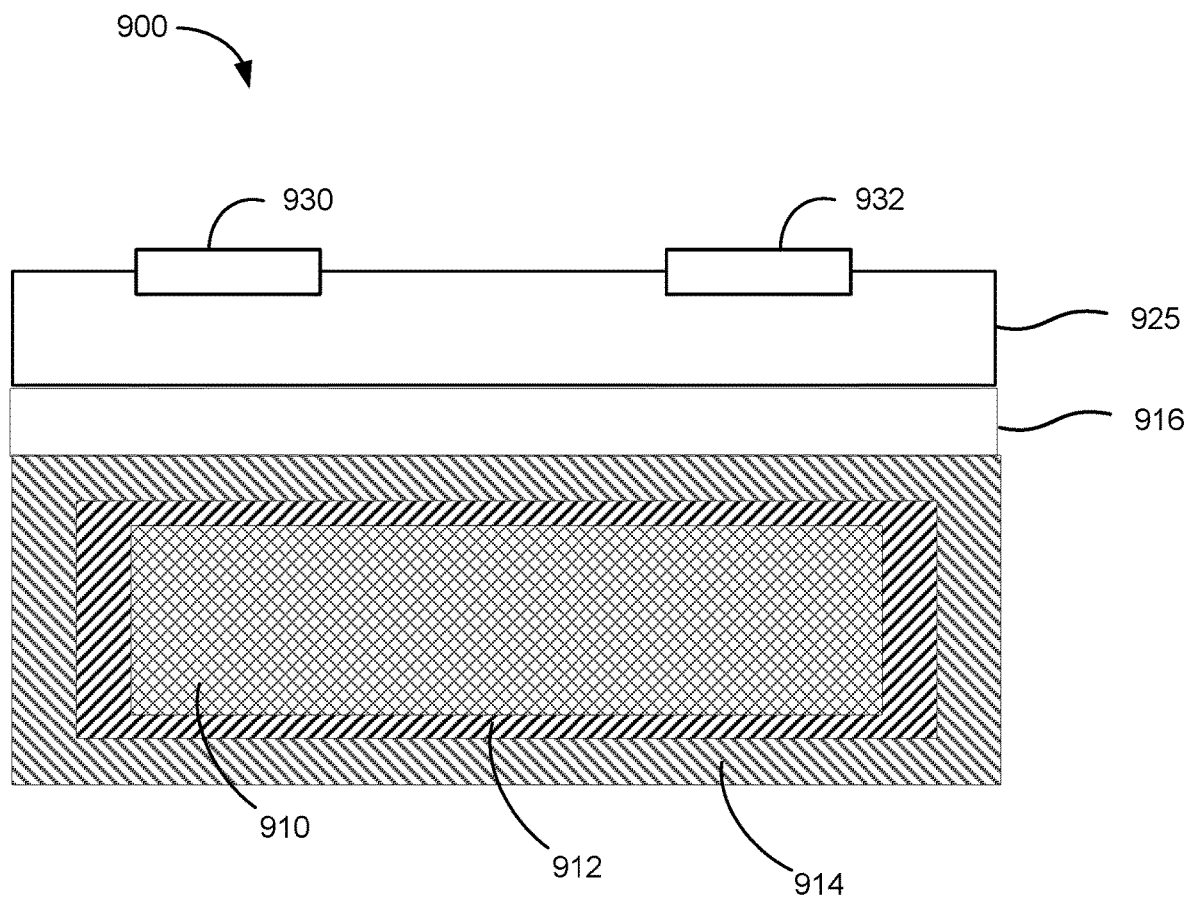
FIG. 9 is a simplified schematic diagram illustrating an aluminum nitride based silicon-on-insulator substrate structure according to an embodiment of the present invention.

FIG. 9 is a simplified schematic diagram illustrating an aluminum nitride based silicon-on-insulator substrate structure 900 according to an embodiment of the present invention, which includes what can be referred to as an engineered substrate. The substrate structure 900 includes a polycrystalline, e.g., an aluminum nitride (AlN), substrate 910 that is coated with one or more thin film layers 912 and 914. For clarity, the polycrystalline substrate 910 can be referred to as an AlN substrate herein.

The AlN substrate 910, which can be on the order of 500-1000 μm thick and have a diameter of 6", 8", 12", or larger, is a polycrystalline ceramic material that provides mechanical support for layers deposited thereon. In contrast with conventional SOI designs using single crystal silicon substrates, the ceramic AlN substrate illustrated in FIG. 1 is a polycrystalline substrate supporting the single crystal silicon layer utilized in the fabrication of the CMOS devices.

Although AlN is utilized as an example of a polycrystalline substrate material in the embodiment illustrated in FIG. 9, the present invention is not limited to AlN and other polycrystalline ceramic materials can be utilized according to embodiments of the present invention to achieve the benefits described herein. These alternative ceramic materials include, as discussed above, AlGaN, GaN, SiC, combinations thereof, or the like. One of ordinary skill in the art would recognize many variations, modifications, and alternatives.

The substrate structure 900 also includes one or more thin film layers as illustrated in FIG. 9. Although two thin film layers are illustrated, embodiments of the present invention are not limited to this particular number and other numbers of thin film layers can be utilized according to embodiments of the present invention, including a single thin film layer or three or more thin film layers.

In an exemplary embodiment, the thin film layers comprise a tetraethyl orthosilicate (TEOS) layer 912 that is 100 Å thick and provides an adhesion function for the after-deposited layer. For example, the TEOS layer can improve the adhesion of a silicon nitride layer 914 when it is deposited to the TEOS layer. The thickness of the TEOS layer can vary depending on the particular application, for example, over a range of ~10 Å to 100 Å, as discussed above, to 1,000 Å. In some embodiments for which the adhesion of the second layer, e.g., silicon nitride, to the underlying polycrystalline substrate is good, the TEOS layer can be omitted.

The one or more thin film layers also include a nitride layer 914 that is deposited on the TEOS layer 912 and provides a diffusion barrier to the underlying ceramic materials to prevent out diffusion of unwanted background elements from the ceramic materials into the device layers. The nitride layer 914 can include one or more materials such as silicon nitride, silicon oxynitride, combinations thereof, or the like. The nitride layer 914 is 500 Å thick in some embodiments.

In some embodiments, the thin film layers are deposited such that they completely surround and encase the polycrystalline substrate 910, thereby preventing the material of the substrate from interacting with processing tools and the like.

In some embodiments, one or more thin film layers can also include a conduction layer and a second adhesion layer, similar to the engineered substrate structure illustrated in FIGS. 1, 3, and 4.

In order to planarize the polycrystalline ceramic substrate, a dielectric layer (e.g., oxide) can be deposited and then a material removal process, (e.g., a CMP process) can be used to remove most or all of the deposited dielectric, with any crevices in the substrate being filled with the deposited dielectric. In some embodiments, the dielectric can comprise silicon dioxide, TEOS, spin-on-dielectric (SOD), spin-on-glass (SOG), combinations thereof, or the like. Thus, the substrate can be processed as desired, for example, planarized, before the deposition of the one or more thin film layers. Embodiments of the present invention provide methods of fabricating substrate structures by, for example, providing a polycrystalline substrate, optionally depositing an oxide layer on the substrate, CMP processing the optional oxide layer to planarize the substrate, depositing one or more thin films, depositing an oxide layer on the substrate, and performing a layer transfer process to join a single crystal silicon layer to the oxide layer.

An oxide layer 916 is deposited and provides a bonding surface that is used during the wafer transfer process to bond the single crystal silicon layer to the substrate structure. The oxide layer 916, illustrated as deposited on a portion of the nitride layer 914, can be as thin as a few monolayers and as thick as 20,000 Å. The oxide layer 916 can have a range of thicknesses depending on the particular implementation. For example, the oxide layer 916 ranges in thickness from about 10 nm to 1 μm, for example, 10 nm, 20 nm, 30 nm, 40 nm, 50 nm, 60 nm, 70 nm, 80 nm, 90 nm, 100 nm 0.15 μm, 0.2 μm, 0.25 μm, 0.3 μm, 0.5 μm, 0.75 μm, 1 μm, 2 μm, or the like. Layers 912/914/916, which can be utilized with or replaced by other layers, provide functionality as described herein. The thin film layers/oxide layer 916 are typically amorphous materials to which the single crystal silicon layer 925 is bonded using a layer transfer process.

The oxide layer 916, which is utilized in a conventional SOI structure to isolate the electronic circuits, e.g., LDMOS circuits, and prevent leakage to the conducting substrate, can be thinned in embodiments of the present invention since the substrate has a high resistivity. In embodiments as described herein, since the AlN substrate is insulating, the oxide layer primarily serves to provide an adhesion layer for the single crystal silicon during the layer transfer process, greatly reducing the thickness in comparison with conventional designs. In some embodiments, one or more epitaxial silicon layers with predetermined characteristics (e.g., n-type, p-type, etc.) can be grown on top of the single crystal silicon layer 125 to provide a desired base for CMOS/LDMOS device manufacturing.

Referring to FIG. 9, a single crystal silicon layer 925, joined to the oxide layer 916 using a layer transfer process provides the single crystal silicon material in which the CMOS, e.g., LDMOS, circuits can be fabricated. In an embodiment, the single crystal silicon layer 925 is (100) silicon. A variety of CMOS, LDMOS, and other electronic devices can be fabricated in the single crystal silicon layer 925. As an example, LDMOS devices 930 and 932 are illustrated in FIG. 9.

As illustrated by the thermal simulation results described below, for the same power dissipation of 1 W, an LDMOS structure on an oxide layer 30 nm thick will run at a much cooler temperature of 40° C. compared to 69° C. on a conventional SOI structure with an oxide layer thickness of 1 µm, which is a commonly used oxide layer thickness to prevent leakage and provide RF signal isolation.

Table 1 illustrates the thermal resistance of a buried oxide layer of an SOI structure using different substrates. For three substrates, AlN as utilized in embodiments of the present invention, silicon, and sapphire, the buried oxide thickness was varied from 1 µm to 100 nm to 30 nm. The thermal resistance of the buried oxide layer was computed as shown in Table 1.

TABLE 1

| | Thermal Resistance, $\Theta_{JA}$ (K/W) | | |
|---|---|---|---|
| Substrate | 1 µm thick oxide | 100 nm thick oxide | 30 nm thick oxide |
| AlN | 40 | 16 | 13 |
| Silicon | 42 | 21 | 16 |
| Sapphire | 55 | 36 | 34 |

As illustrated in Table 1, the AlN substrate provides the lowest thermal resistance across all oxide thicknesses while achieving improved RF loss and lower leakage levels. For a silicon substrate with a 1 µm thick buried oxide layer, the thermal resistance is 42 K/W, compared to a thermal resistance of 40 K/W for an AlN substrate and an oxide thickness of 1 µm. Because of the electrically insulating characteristics of the AlN substrate that prevent leakage and RF absorption, the oxide thickness can be decreased from the 1 µm thickness to greatly reduced thicknesses. For thicknesses of 100 nm and 30 nm, the thermal resistance for the AlN substrate is reduced as illustrated in Table 1, for example a thermal resistance of 13 K/W for an AlN substrate and an oxide thickness of 30 nm. The junction temperature ($T_J$) for corresponding devices can be computed, using an ambient temperature ($T_A$) of 300K and a power dissipation (P) of 1 W, as:

$T_J=T_A+(\Theta_{JA}\times P)=300K+(13K/W\times 1 W)=313K=40° C.$
for an embodiment of the present invention;
and $T_J=T_A+(\Theta_{JA}\times P)=300K+(42K/W\times 1 W)=342K=69° C.$
for conventional structure.

Thus, embodiments of the present invention clearly outperform SOI with a silicon substrate and provide event greater benefits over SOI with a sapphire substrate.

Because of the significant thermal advantage provided by embodiments of the present invention over conventional substrates, die fabricated on embodiments of the present invention utilizing an AlN substrate will run 42% cooler than on conventional SOI with silicon substrates based on the ratio of the thermal resistances of embodiments to conventional substrates. It has been demonstrated that a 25% increase in output power can be achieved for an LDMOS RF power amplifier by lowering the thermal resistance of the die by 15% to 30%. Accordingly, utilizing embodiments of the present invention and the reduced thermal resistance achieved, a 50% increase in power output is achievable using state of the art LDMOS technology.

In addition to increasing power output, the lower thermal resistance provided by embodiments of the present invention enables the die size to be reduced at a given power output. As an example, utilizing the substrate structure described herein, the die size can be decreased by 33% and will operate at a temperature 47% cooler than the original die size on a conventional SOI on silicon substrate. A die size decreased by 67% in embodiments of the present invention will operate at a temperature 67% cooler than the original die size on a conventional SOI on silicon substrate. As a result, the present invention enables significantly increased power output to be achieved from a significant decrease in die size, which results in a greater number of die per wafer. For instance, if the cost of a 150 mm SOI wafer and a substrate structure utilizing AlN is comparable at $650, a savings of 37% can be realized by shrinking the die by 33%. The inventors believe that in a production environment, the substrate structure utilizing AlN can actually be much lower, for example, about $150.

Figure 10:
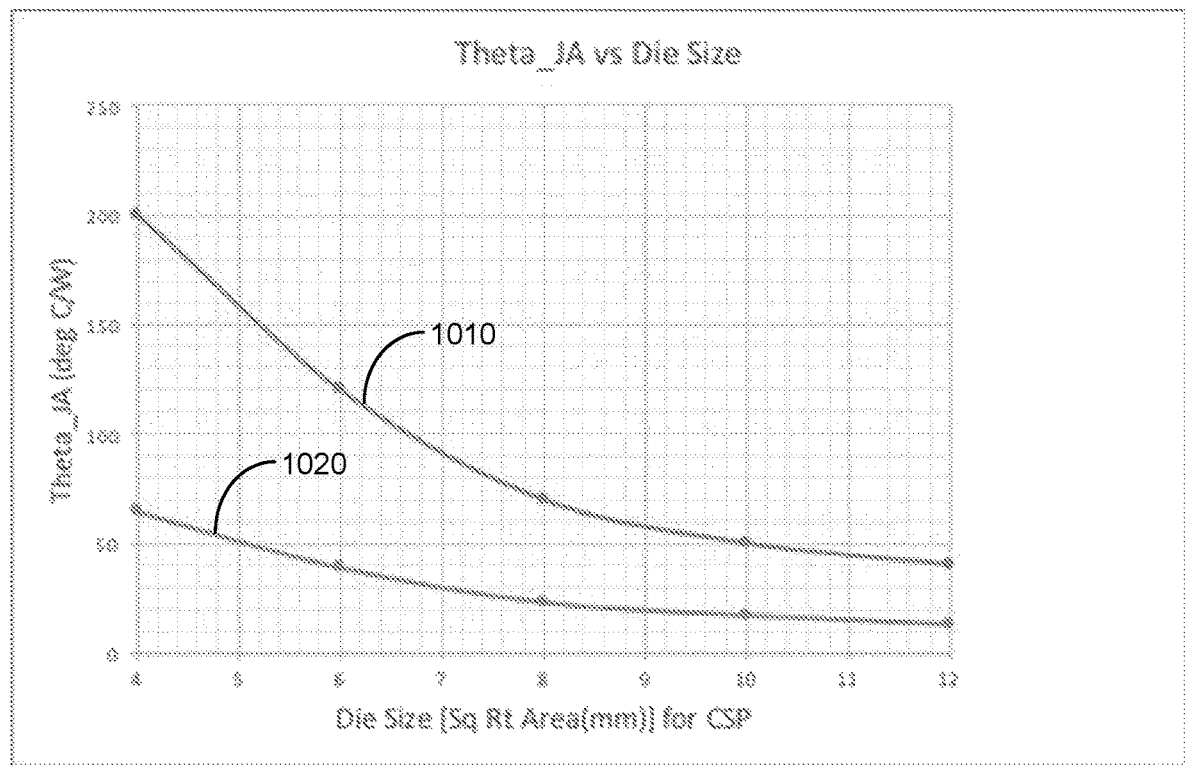
FIG. 10 is a simplified plot illustrating thermal resistance as a function of die size for a conventional silicon-on-insulator substrate structure and an aluminum nitride based silicon-on-insulator substrate structure according to an embodiment of the present invention.

FIG. 10 is a simplified plot illustrating thermal resistance of a conventional structure and an substrate structure of the present invention. As illustrated in FIG. 10, for a conventional structure in a chip scale package, such as an SOI on silicon substrate (1010), the thermal resistance is 200° C./W for a die size of 4 mm² and drops to ~50° C./W for a die size of 12 mm². In contrast, utilizing an embodiment of the present invention, an AlN substrate structure (1020), the thermal resistance is significantly lower for all die sizes, providing a thermal resistance of 70° C./W for a die size of 4 mm² and decreasing to ~15° C./W for a die size of 12 mm². Thus, for a chip scale package, the thermal resistance changes by almost a factor of eight with die size. The cooler die temperature is one of the key drivers that leads to improved RF performance. For silicon-based devices, including LDMOS, every 10 to 15° C. reduction in junction temperature results in doubling the mean time to failure (MTTF), leading to better reliability.

Figure 11:
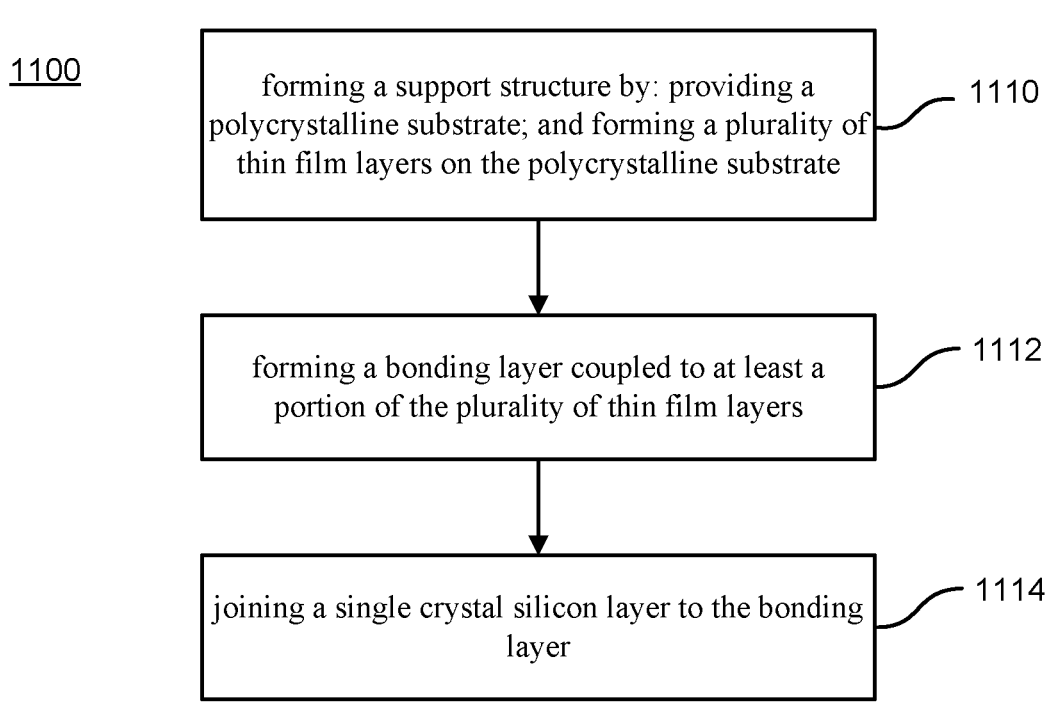
FIG. 11 is a simplified flowchart illustrating a method of fabricating a substrate structure according to an embodiment of the present invention.

FIG. 11 is a simplified flowchart illustrating a method 1100 of fabricating a substrate structure according to an embodiment of the present invention. The method 1100 includes forming a support structure (1110). Forming the support structure may include providing a polycrystalline substrate, and forming a plurality of thin film layers on the polycrystalline substrate. In some embodiments, the polycrystalline substrate includes polycrystalline aluminum nitride. Forming the plurality of thin film layers may include encapsulating the polycrystalline substrate in an adhesion shell, and encapsulating the adhesion shell in a barrier material. In some embodiments, the adhesion shell may include tetraethyl orthosilicate (TEOS), and the barrier material may include silicon nitride.

The method 1100 further includes forming a bonding layer coupled to at least a portion of the plurality of thin film layers (1112), and joining a single crystal silicon layer to the bonding layer (1114). In some embodiments, joining the single crystal silicon layer includes performing a layer transfer process from a silicon wafer having a (100) crystalline orientation. In some embodiments, the method 1100 may further include forming a plurality of laterally diffused MOSFET (LDMOS) devices coupled to the single crystal silicon layer.

It should be appreciated that the specific steps illustrated in FIG. 11 provide a particular method of fabricating an engineered substrate structure according to another embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

As discussed above, the thermal advantages provided by embodiments of the present invention can be used to increase power output for a given die size, shrink die size for a given power output, or perform combinations thereof.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A substrate structure comprising:
a polycrystalline substrate;
a plurality of thin film layers comprising:
an electrically conductive layer coupled to the polycrystalline substrate; and
a barrier layer fully encapsulating the polycrystalline substrate and the electrically conductive layer;
a bonding layer coupled to at least a portion of the plurality of thin film layers; and
a single crystal silicon layer joined to the bonding layer.

2. The substrate structure of claim 1 further comprising:
a plurality of laterally diffused MOSFET (LDMOS) devices coupled to the single crystal silicon layer.

3. The substrate structure of claim 1 wherein the single crystal silicon layer comprises an exfoliated silicon layer having a (100) crystalline orientation.

4. The substrate structure of claim 1 wherein the polycrystalline substrate comprises polycrystalline aluminum nitride.

5. The substrate structure of claim 1 wherein the plurality of thin film layers further comprises:
an adhesion layer coupled to the polycrystalline substrate, wherein the electrically conductive layer is coupled to the polycrystalline substrate via the adhesion layer.

6. The substrate structure of claim 5 wherein:
the adhesion layer comprises a tetraethyl orthosilicate (TEOS) layer encapsulating the polycrystalline substrate; and
the barrier layer comprises a silicon nitride layer encapsulating the TEOS layer.

7. The substrate structure of claim 1 wherein the bonding layer comprises silicon oxide and has a thickness of 1 µm or less.

8. The substrate structure of claim 7 wherein the bonding layer has a thickness of 300 nm or less, 100 nm or less, or 30 nm or less.

9. The substrate structure of claim 1 wherein a thermal resistance of the polycrystalline substrate is less than about 40 K/W.

10. The substrate structure of claim 1 wherein a thermal conductivity of the polycrystalline substrate is greater than about 150 W/(m·K).

11. The substrate structure of claim 1 wherein an RF absorption coefficient of the polycrystalline substrate is less than an RF absorption coefficient of a silicon substrate.

12. The substrate structure of claim 1 wherein an electrical resistivity of the polycrystalline substrate is greater than about 1014 ohm-cm.

13. The substrate structure of claim 1 wherein the electrically conductive layer fully encapsulates the polycrystalline substrate.

14. A method of fabricating a substrate structure, the method comprising:
forming a support structure by:
providing a polycrystalline substrate; and
forming a plurality of thin film layers the plurality of thin film layers comprising:
an electrically conductive layer coupled to the polycrystalline substrate; and
a barrier layer fully encapsulating the polycrystalline substrate and the electrically conductive layer
forming a bonding layer coupled to at least a portion of the plurality of thin film layers; and
joining a single crystal silicon layer to the bonding layer.

15. The method of claim 14 further comprising forming a plurality of laterally diffused MOSFET (LDMOS) devices coupled to the single crystal silicon layer.

16. The method of claim 14 wherein joining the single crystal silicon layer comprises performing a layer transfer process from a silicon wafer having a (100) crystalline orientation.

17. The method of claim 14 wherein the polycrystalline substrate comprises polycrystalline aluminum nitride.

18. The method of claim 14 wherein the plurality of thin film layers further comprises:
an adhesion shell encapsulating the polycrystalline substrate, wherein the electrically conductive layer is coupled to the polycrystalline substrate via the adhesion shell.

19. The method of claim 18 wherein:
the adhesion shell comprises tetraethyl orthosilicate (TEOS); and
the barrier layer comprises silicon nitride.

20. The method of claim 14 wherein the bonding layer comprises silicon oxide and has a thickness of 1 µm or less, 300 nm or less, 100 nm or less, or 30 nm or less.

21. A device structure comprising:
a support structure comprising:
a polycrystalline ceramic core;
a first adhesion layer comprising a first tetraethyl orthosilicate (TEOS) layer encapsulating the polycrystalline ceramic core;
a conductive layer comprising a polysilicon layer encapsulating the first TEOS layer;
a second adhesion layer comprising a second TEOS layer encapsulating the polysilicon layer; and
a barrier layer comprising a silicon nitride layer encapsulating the second TEOS layer;
a silicon oxide layer coupled to the support structure;
a single crystal silicon layer coupled to the silicon oxide layer; and
a plurality of laterally diffused MOSFET (LDMOS) devices coupled to the single crystal silicon layer.

22. The device structure of claim 21 wherein the polycrystalline ceramic core comprises polycrystalline aluminum nitride.

23. The device structure of claim 22 wherein the single crystal silicon layer has a (100) crystalline orientation.

24. The device structure of claim 22 wherein the silicon oxide layer has a thickness of 1 µm or less, 300 nm or less, 100 nm or less, or 30 nm or less.

* * * * *